(12) United States Patent  
Yan et al.

(10) Patent No.: US 12,484,402 B2
(45) Date of Patent: Nov. 25, 2025

(54) DISPLAY PANEL AND DISPLAY DEVICE (71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zhenglong Yan, Beijing (CN); Yanyang Shang, Beijing (CN); Zhu Wang, Beijing (CN); Ling Shi, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 18/025,051
(22) PCT Filed: May 23, 2022
(86) PCT No.: PCT/CN2022/094405
§ 371 (c)(1),
(2) Date: Mar. 7, 2023
(87) PCT Pub. No.: WO2023/225778
PCT Pub. Date: Nov. 30, 2023

(65) Prior Publication Data
US 2025/0089482 A1  Mar. 13, 2025

(51) Int. Cl.
H10K 59/131 (2023.01)
H10K 59/40 (2023.01)

(52) U.S. Cl.
CPC .......... H10K 59/131 (2023.02); H10K 59/40 (2023.02)

(58) Field of Classification Search
None
See application file for complete search history.

(56) References Cited

U.S. PATENT DOCUMENTS

2018/0151662 A1* 5/2018 Rhe .................. H10K 77/111
2019/0273124 A1   9/2019 Leng et al.
(Continued)

FOREIGN PATENT DOCUMENTS

CN    108389869 A    8/2018
CN    108417604 A    8/2018
(Continued)

Primary Examiner — Kyoung Lee
(74) Attorney, Agent, or Firm — WHDA, LLP (57) ABSTRACT The present disclosure provides a display panel and a display device. The display panel includes: a base substrate including a display area and a non-display area, the non-display area including: a lead area, a bending area, and a bonding area; a plurality of touch wirings arranged on the base substrate, one end of the touch wirings being connected to the display area, and the other end extending to the bonding area via the lead area and the bending area; signal wirings including a first portion located at the lead area, a second portion located at the bending area, and a third portion located at the bonding area, the second portion including a plurality of sub-signal wirings, the plurality of sub-signal wirings being divided into a plurality of sub-signal wiring groups; where in the bending area, the touch wirings and the sub-signal wiring groups are alternately distributed in a first direction.

20 Claims, 5 Drawing Sheets (56) References Cited

U.S. PATENT DOCUMENTS

2019/0319201 A1  10/2019  Goh et al.
2020/0411598 A1  12/2020  Gwon et al.
2021/0333919 A1  10/2021  Wu et al.

FOREIGN PATENT DOCUMENTS

| CN | 112151577 A | 12/2020 |
| CN | 112667106 A | 4/2021 |
| CN | 113206139 A | 8/2021 |

\* cited by examiner

DISPLAY PANEL AND DISPLAY DEVICE

CROSS-REFERENCE TO RELATED APPLICATION

The present application is the U.S. national phase of PCT Application No. PCT/CN2022/094405 filed on May 23, 2022, the entire content of which is incorporated herein by reference.

TECHNICAL FIELD

Embodiments of the present disclosure relate to the field of display technology, in particular to a display panel and a display device.

BACKGROUND

At present, most OLED (Organic Light-Emitting Diode) display devices adopt FMLOC (flexible multi-layer on cell) technology, which can greatly save cost and make the display panel thinner because it completes the manufacturing steps of the touch layer on the Panel, which is conducive to improve the folding performance.

FMLOC technology has been gradually promoted from conventional products to narrow-border projects, especially nowadays the borders of display panels are narrower and narrower, so it is necessary to put enough TP (touch panel) leads under the limited border. How to ensure that sufficient touch leads are placed under a narrow border is a problem to be solved.

SUMMARY

The embodiments of the present disclosure provide a display panel and a display device for solving the problem of how to ensure that sufficient touch leads are placed under a narrow border.

In order to solve the above technical problems, the present disclosure is realized as follows:

In a first aspect, an embodiment of the present disclosure provides a display panel including:
  a base substrate including a display area and a non-display area located at the periphery of the display area, and the non-display area including a lead area, a bending area, and a bonding area;
  a plurality of touch wirings arranged on the base substrate, one end of the plurality of touch wirings being connected to the display area, and the other end extending to the bonding area via the lead area and the bending area;
  signal wirings including a first portion located at the lead area, a second portion located at the bending area, and a third portion located at the bonding area, the second portion including a plurality of sub-signal wirings, the plurality of sub-signal wirings being divided into a plurality of sub-signal wiring groups, and the sub-signal wiring groups including at least one of the sub-signal wirings;
  where in the bending area, the touch wirings and the sub-signal wiring groups are alternately distributed in a first direction, and the first direction intersects with an extension direction of the touch wirings and the sub-signal wirings in the bending area.

Alternatively, a portion of the touch wirings in the bending area and a second portion of the signal wirings are made of a single layer of metal.

Alternatively, the portion of the touch wirings in the bending area and the second portion of the signal wirings are arranged in the same layer and the same material.

Alternatively, the portion of the touch wirings in the bending area and the second portion of the signal wirings are arranged in the same layer and the same material as a source-drain metal layer or a gate metal layer of the display panel.

Alternatively, in the lead area and/or the bonding area, the touch wirings and the signal wirings are arranged in different layers, and the touch wirings are located on one side of the signal wirings away from the base substrate.

Alternatively, in the lead area and/or the bonding area, the signal wirings are arranged in the same layer and the same material as the source-drain metal layer of the display panel.

Alternatively, in the lead area and/or the bonding area, the signal wirings are arranged in a plate shape, and the orthographic projection of the touch wirings on the base substrate is at least partially located in the orthographic projection area of the signal wirings on the base substrate.

Alternatively, in the bending area, each of the touch wirings occupies one pitch, and each of the sub-signal wiring groups occupies two pitches.

Alternatively, the touch wirings include touch driving wirings and touch sensing wirings.

Alternatively, the signal wirings are VSS signal lines.

Alternatively, the first direction is perpendicular to the extension direction of the touch wirings and the sub-signal wirings in the bonding area.

In a second aspect, an embodiment of the present disclosure provides a display device including the display panel as described in the first aspect.

In the embodiments of the present disclosure, in a bending area of a non-display area of a display panel, touch wirings and sub-signal wiring groups (including at least one of the sub-signal wirings) are arranged alternately, so that the space utilization rate is improved, and the width of the bending area can be effectively reduced, which is conducive to the design of the narrow border. At the same time, the distance between adjacent touch wirings is also increased, and the mutual interference between signals of the touch wirings is reduced. In addition, the area occupied by the signal wirings is also effectively increased, reducing the resistance of the signal wirings.

BRIEF DESCRIPTION OF THE DRAWINGS

Various other advantages and benefits will become apparent to those of ordinary skill in the art upon reading the following detailed description of the preferred embodiments. The drawings are only for the purposes of illustrating the preferred embodiments and are not considered as limiting the present disclosure. Moreover, reference numerals designate like components throughout the drawings. In the drawings.

DETAILED DESCRIPTION

The technical solutions in the examples of the present disclosure will be clearly and completely described below with reference to the drawings in the examples of the present disclosure. Obviously, the described embodiments are a part of the embodiments of the present disclosure, rather than all the examples. Based on the embodiment in the present disclosure, all other embodiments obtained by those of ordinary skill in the art without creative labor belong to the scope of protection of the present disclosure.

Figure 1:
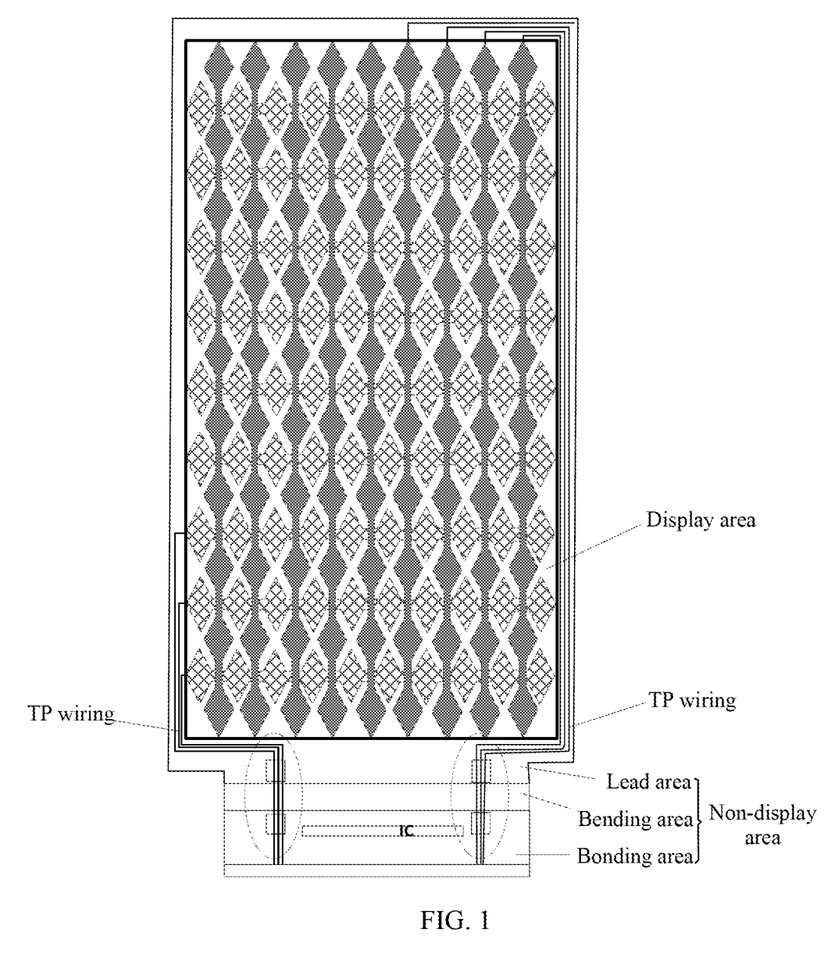
FIG. 1 is a schematic diagram of the overall structure of a display panel related to the present disclosure.

With reference to FIG. 1, FIG. 1 is a schematic diagram of the overall structure of a display panel related to the present disclosure.

The display panel includes: a base substrate including a display area and a non-display area located at the periphery of the display area, and the non-display area includes: a lead area, a bending area, and a bonding area. The lead area is located at the periphery of the display area, the bending area, and the bonding area are only located on one side of the display area, and on the side, the lead area, the bending area and the bonding area are arranged in sequence in the direction away from the display area.

The display panel further includes a plurality of touch panel (TP) wirings, one end of the plurality of touch wirings is connected to the display area and is connected to touch electrodes (such as grid-shaped electrodes in FIG. 1) in the display area, and the other end extends to the bonding area via the lead area and the bending area and is bound with the touch IC in the bonding area.

The display panel further includes signal wirings (not shown in FIG. 1), one end of the signal wirings is connected to the display area, and the other end extends to the bonding area via the lead area and the bending area, for providing signals for driving circuits in the display panel.

Figure 2:
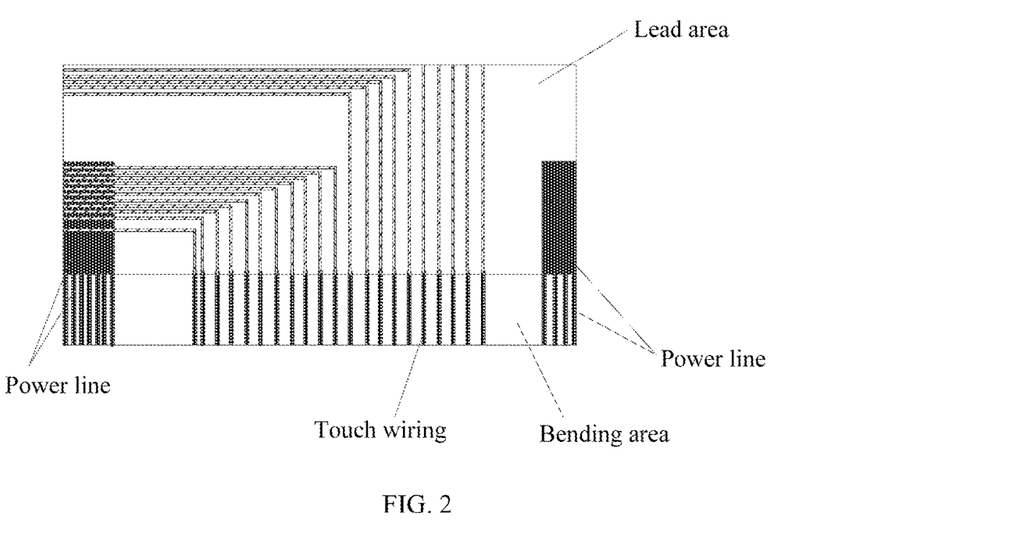
FIG. 2 is a schematic diagram of a wiring layout of a non-display area of the display panel in the related art.

With reference to FIG. 2, FIG. 2 is a schematic diagram of a wiring layout of a non-display area of a display panel in the related art. In the lead area, signal wirings and touch wirings are arranged on different layers: in the bending area, the signal wirings are arranged on two sides of the touch wirings, and a certain distance is separated between the signal wirings and the touch wirings on both sides; at the same time, in order to avoid mutual interference between the touch wirings, adjacent touch wirings also need to be separated by a certain distance; and due to the above spacing requirements, the width of the bending area cannot be set smaller, which is not conducive to the design of narrow borders.

Figure 3:
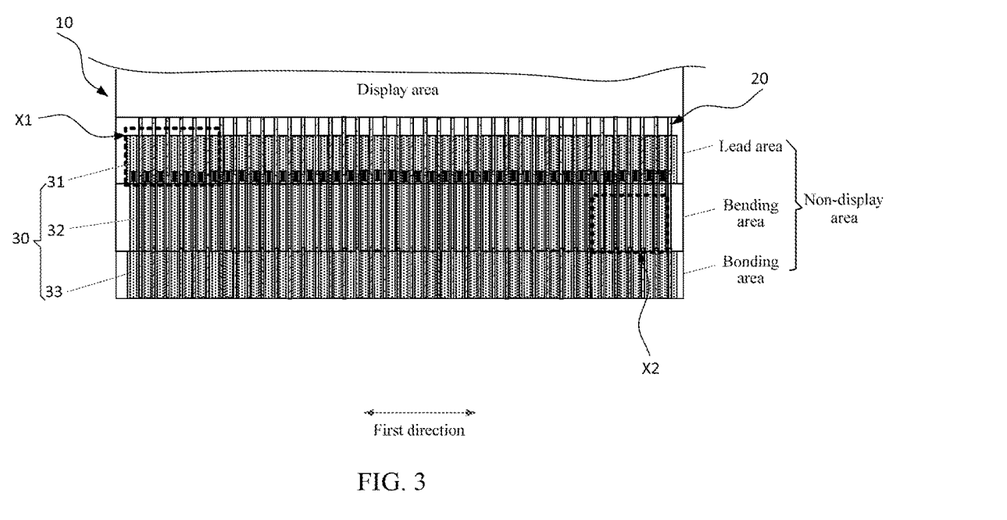
FIG. 3 is a structural diagram of the display panel according to an embodiment of the present disclosure.

To solve the above problems, refer to FIG. 3. An embodiment of the present disclosure provides a display panel, which includes:

a base substrate 10, including a display area and a non-display area located at the periphery of the display area. Only the non-display area located on one side of the display area is shown in FIG. 3, and the non-display area may also include non-display areas located on other sides of the display area, such as the left side, the right side, and/or the upper side, which are not shown in FIG. 3. Display units and drive circuits for driving the display units are arranged in the display area to realize a display function, and at the same time, touch electrodes are also arranged in the display area to realize a touch function. The non-display area includes: a lead area, a bending area, and a bonding area. The lead area is used for setting various wirings of the display panel, the lead area can be located at the periphery of the display area (that is, the periphery of the display area is arranged around the lead area), the bonding area is used for bonding the wiring and the IC, the bending area is used for bending the non-display area, so that the bonding area is bent to the non-display side of the display panel, thereby realizing a narrow border, the bending area and the bonding area are located at one side of the display area (for example, the lower side of the display area in FIG. 3). On the side, the lead area, the bending area and the bonding area are arranged in sequence in the direction away from the display area.

A plurality of touch wirings 20 are arranged on the base substrate 10, one end of the plurality of touch wirings 20 is connected to the display area (namely, connected to touch electrodes in the display area, and the connection mode can be seen in FIG. 1), and the other end extends to the bonding area via the lead area and the bending area, and is used for bonding to a touch IC; the touch IC is used to transmit the touch driving signals to the touch wirings; and receive the touch sensing signals fed back by the touch wirings, and determine the touch information, such as the touch position, according to the touch sensing signals;

signal wirings 30 include a first portion 31 located at the lead area, a second portion 32 located at the bending area, and a third portion 33 located at the bonding area. The first portion 31, the second portion 32, and the third portion 33 are connected in sequence. The second portion 32 includes a plurality of sub-signal wirings, the plurality of sub-signal wirings being divided into a plurality of sub-signal wiring groups, and each of the sub-signal wiring groups includes at least one of the sub-signal wirings; In the drawing shown in FIG. 3, for example, one sub-signal wiring group includes one sub-signal wiring. Of course, in other embodiments of the present disclosure, the number of sub-signal wirings in one sub-signal wiring group is not limited to this. For example, with reference to FIG. 4, in the embodiment shown in FIG. 4, one sub-signal wiring group includes two sub-signal wirings, refer to the two sub-signal wirings framed by the dashed line frame in FIG. 4. However, in practical applications, the number of sub-signal wirings in the sub-signal wiring groups is often more. The number of sub-signal wirings in the sub-signal wiring group can be set according to process conditions and bending requirements.

In the bending area, the touch wirings 20 and the sub-signal wiring groups are alternately distributed in a first direction, and the first direction intersects with an extension direction of the touch wirings 20 and the sub-signal wirings in the bonding area (the first direction can be seen in FIG. 3).

In the embodiments of the present disclosure, in a bending area of a non-display area of a display panel, touch wirings and sub-signal wiring groups (including at least one of the sub-signal wirings) are arranged alternately, so that the space utilization rate is improved, and the width of the bending area can be effectively reduced, which is conducive to the design of the narrow border. At the same time, the distance between adjacent touch wirings is also increased, and the mutual interference between signals is reduced. In addition, the area occupied by the signal wirings is also effectively increased, reducing the resistance of the signal wirings.

In the embodiments of the present disclosure, alternatively, the touch mode of the display panel may be a mutual capacitance touch mode, that is, touch wirings include Tx (transmitting) wirings (also called touch driving wirings) and Rx (receiving) wirings (also called touch sensing wirings). The Tx wirings are used to connect to touch driving electrodes (for example, the electrodes extending vertically in the display area in FIG. 1) and transmit touch driving signals to the touch drive electrodes, and the Rx wirings are used to connect to the touch sensing electrodes (for example, the electrodes extending laterally in the display area in FIG. 1) and receive touch sensing signals induced by the touch sensing electrodes. The touch wirings described in the embodiments of the present disclosure may include Tx wirings and/or Rx wirings.

In the embodiments of the present disclosure, alternatively, the signal wirings 30 are signal wirings for transmitting signals to the driving circuits in the display panel, such as VSS signal lines. Of course, the possibility of other types of signal wirings is not excluded.

In the embodiments of the present disclosure, alternatively, the first direction is perpendicular to the extension direction of the touch wirings and the sub-signal wirings in the bonding area, to effectively reduce the width of the bending area as much as possible, which is conducive to realize a narrow border. Of course, in other embodiments of the present disclosure, the first direction and the extending direction of the touch wirings and the sub-signal wirings in the bonding area may also have other included angles.

Figure 5:
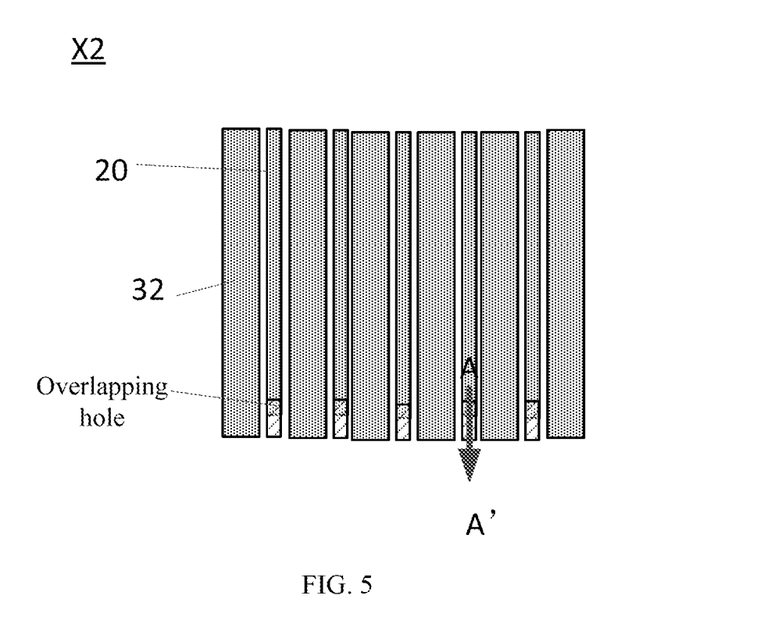
FIG. 5 is an enlarged schematic diagram at the position of the dashed line frame X2 in the bending area in FIG. 3.

In the embodiments of the present disclosure, alternatively, with reference to FIG. 5, FIG. 5 is an enlarged schematic diagram at the position of the dashed line frame X2 in the bending area in FIG. 3. The portion of the touch wirings 20 in the bending area and the second portion 32 of the signal wirings 30 are made of a single layer of metal, and the touch wirings 20 and the signal wirings 30 are made of single-layer metal in the bending area, thus facilitating the bending of the bending area.

In the embodiments of the present disclosure, further alternatively, the portion of the touch wirings 20 in the bending area and the second portion 32 of the signal wirings 30 are arranged in the same layer and the same material, that is, in the bending area, the touch wirings 20 and the signal wirings 30 can be formed by an one-time patterning process, so that the production costs can be reduced.

In the embodiments of the present disclosure, the metal used for the portion of the touch wirings 20 in the bending area and the second portion 32 of the signal wirings 30 can be, for example, a metal with better ductility to avoid breaking during bending, for example, a metal such as Al (aluminum), cu (copper), or Mo (molybdenum) can be used. In the embodiments of the present disclosure, further alternatively, the portion of the touch wirings in the bending area 20 and the second portion 32 of the signal wirings 30 are arranged in the same layer and the same material as the source-drain metal layer (SD metal) or the gate metal layer (gate metal) of the display panel, that is, it is formed with the source-drain or gate of the thin film transistor in the driving circuit of the display panel by an one-time patterning process, so that the production costs can be further reduced.

Figure 4:
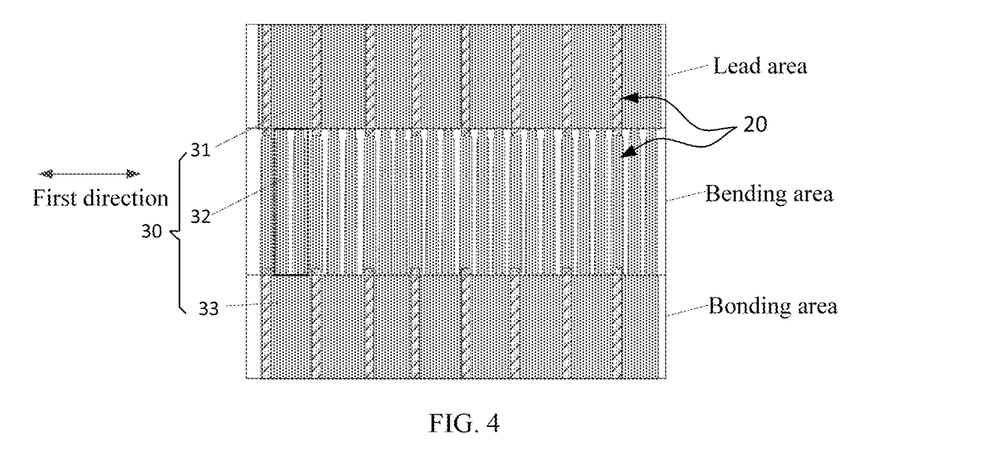
FIG. 4 is a schematic diagram of a wiring layout of the non-display area of the display panel according to another embodiment of the present disclosure.

In the embodiments of the present disclosure, alternatively, in the lead area, the touch wirings 20 and the signal wirings 30 are arranged in different layers, and the touch wirings 20 are located on one side of the signal wirings 30 away from the base substrate 10, and in the bonding area, the touch wirings are located at an upper film layer, to facilitate bonding with the touch IC. With reference to FIG. 4, FIG. 4 is an enlarged schematic diagram at the position of the dashed line frame X1 in the lead area in FIG. 3. As can be seen from FIG. 4, in the lead area, the touch wirings 20 and the first portion 31 of the signal wirings 30 are located in different layers, and the touch wirings 20 are located on the side of the signal wirings 30 away from the base substrate. In the embodiments of the present disclosure, alternatively, the same conductive material is used for the touch wirings 20 in the lead area and the bonding area, thereby saving process costs.

Figure 7:
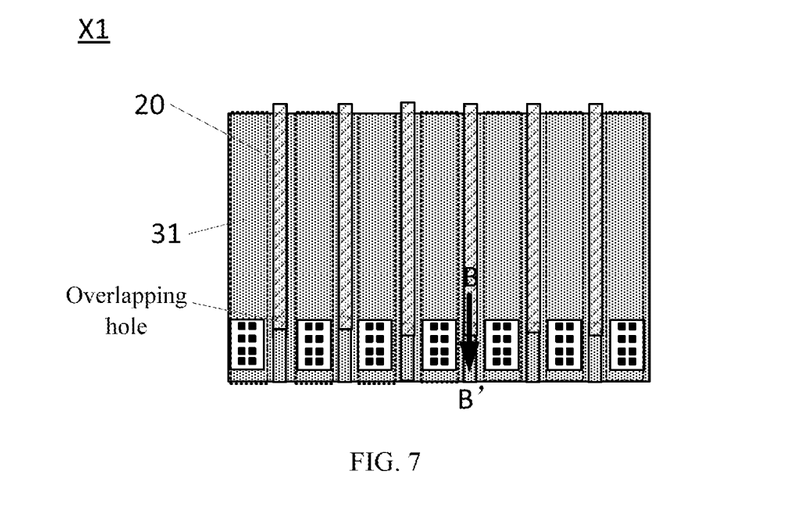
FIG. 7 is an enlarged schematic diagram at the position of the dashed line frame X1 in the lead area in FIG. 3.

In the embodiments of the present disclosure, alternatively, in the lead area and/or the bonding area, the touch wirings 20 and the signal wirings 30 are arranged in different layers, and the touch wirings 20 are located on one side of the signal wirings 30 away from the base substrate 10, and in the bonding area, the touch wirings are located at an upper film layer, to facilitate bonding with the touch IC. With reference to FIG. 7, FIG. 7 is an enlarged schematic diagram at the position of the dashed line frame X1 in the lead area in FIG. 3. As can be seen from FIG. 7, in the lead area, the touch wirings 20 and the first portion 31 of the signal wirings 30 are located in different layers, and the touch wirings 20 are located on the side of the signal wirings 30 away from the base substrate.

In the embodiments of the present disclosure, the touch wirings 20 located in the lead area and the touch wirings 20 located in the bending area can be located in different layers, and they are overlapped by overlapping holes. Likewise, the touch wirings 20 located in the bending area and the touch wirings 20 located in the bonding area can be located in different layers, and they are overlapped by overlapping boles. Alternatively, the same conductive material is used for the touch wirings 20 in the lead area and the bonding area, thereby saving process costs.

In the embodiments of the present disclosure, the signal wirings 30 located in the lead area and the signal wirings 30 located in the bending area may be arranged in the same layer and the same material, or may be located in different layers, for example, the signal wirings 30 located in the lead area are made of SD1 metal, the signal wirings 30 located in the bending area are made of SD2 metal, and they are overlapped by overlapping holes. Likewise, the signal wirings 30 located in the bending area and the signal wirings 30 located in the bonding area may be arranged in the same layer and the same material, or may be located in different layers, for example, the signal wirings 30 located in the bending area are made of SD2 metal, the signal wirings 30 located in the bonding area are made of SD1 metal, and they are overlapped by overlapping holes.

In the embodiments of the present disclosure, alternatively, in the lead area and/or the bonding area, the signal wirings 30 are arranged in the same layer and the same material as the source-drain metal layer of the display panel.

In the embodiments of the present disclosure, alternatively, with reference to FIGS. 3 and 7, in the lead area and/or the bonding area, the signal wirings 30 are arranged in a plate shape, and the orthographic projection of the touch wirings 20 on the base substrate 10 is at least partially located in the orthographic projection area of the signal wirings 30 on the base substrate 10, and the signal wirings 30 are arranged in the plate shape in the lead area and/or the bonding area, which can effectively reduce the signal wiring resistance. In FIG. 3, in order to conveniently represent one signal wiring, a plate-shaped signal wirings in a lead area and the bonding area are divided into a plurality of signal wirings by a dashed line frame, and in practice, the signal wirings may be connected to form one body in the lead area and the bonding area.

Figure 9:
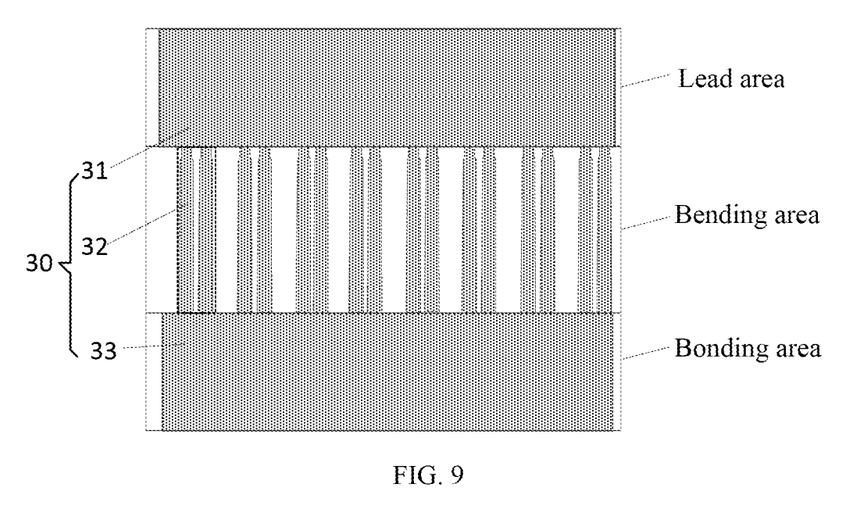
FIG. 9 is a schematic diagram of signal wirings according to an embodiment of the present disclosure.

In the embodiments of the present disclosure, in the bending area, the signal wirings 30 are divided into a plurality of sub-signal wirings 321 arranged in a strip, which is conducive to bend. That is, in the lead area and the bonding area, the signal wirings can be connected to form an integrated plate shape, and in the bending area, the signal wirings are divided into strips, with reference to FIG. 9.

In the disclosed embodiment, alternatively, in the bending area, each of the touch wirings 20 occupies one pitch, and each of the sub-signal wiring groups occupies two pitches. One pitch includes line width plus spacing. For example, the number of the sub-signal wiring groups in the bending area can be determined according to the number of the touch wirings 20; if there are 42 touch wirings 20, the signal wirings 30 can be divided into 43 groups; one group of sub-signal wirings occupies two Pitches, and one-touch wiring 20 occupies one Pitch.

A film layer structure of the display panel in an embodiment of the present disclosure is described below.

Figure 6:
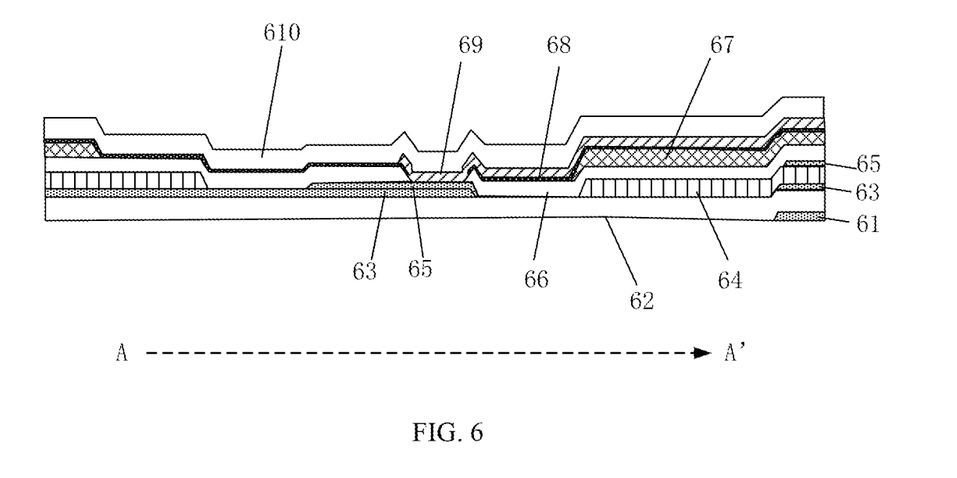
FIG. 6 is a schematic cross-sectional diagram taken at A-A' in FIG. 5.

With reference to FIG. 6, FIG. 6 is a schematic cross-sectional diagram taken at A-A' in FIG. 5. FIG. 5 is a schematic plan diagram of the bending area of the display panel, and FIG. 6 is a schematic cross-sectional diagram of the overlapping area (namely, the exit position of the bending area) of the bending area of the display panel. As can be seen from FIG. 6, the display panel includes:

a first source-drain metal layer (SD1) 61;

a first planarization layer (PLN1) 62, located above the SD1 layer, for serving as an insulating layer between the first source-drain metal layer 61 and the second source-drain metal layer 63;

a second source-drain metal layer (SD2) 63;

a second planarization layer (PLN2) 64 for serving as an insulating layer between the second source-drain metal layer 63 and the third source-drain metal layer 65;

a third source-drain metal layer (SD3) 65, in an A' direction (the direction of the bonding area), the first source-drain metal layer 61, the second source-drain metal layer 63, and the third source-drain metal layer 65 are overlapped as signal wirings; in the bending area, the second source-drain metal layer 63 is used for forming signal wirings and touch wirings; in other embodiments of the present disclosure, the signal wirings of the lead area and the bonding area may also be formed using two layers or one layer of SD metal, which is not limited by the present disclosure. In addition, in the bending area, it is not limited to use SD2 to form signal wirings and touch wirings, and SD1 or SD3 can also be used, which is not limited by the disclosure;

a third planarization layer (PLN3) 66;

a pixel definition layer (PDL) 67; and an insulating layer 68, for serving as an insulating layer of TX wirings and Rx wirings of touch wirings; in the embodiment of the present disclosure, the touch wirings include a first metal layer (M1, not shown in the figures), the insulating layer 68, and a second metal layer (M2) in the lead area and the bonding area. One layer of the first metal layer and the second metal layer is used for forming the Tx wirings and the other layer is used for forming the Rx wirings; the insulating layer may be formed, for example, of silicon nitride or the like.

A second metal layer (M2 layer) 69, which is overlapped with a third source-drain metal layer (SD3) 65 via the overlapping hole on the third planarization layer (PLN3) 66, and the third source-drain metal layer (SD3) 65 is overlapped with the second source-drain metal layer (SD2) 63, to complete the connection of the touch wiring (SD2) in the bending area and the touch wiring (M2) in the bonding area.

A protective layer (OC2 layer) is used to protect the touch wirings.

Figure 8:
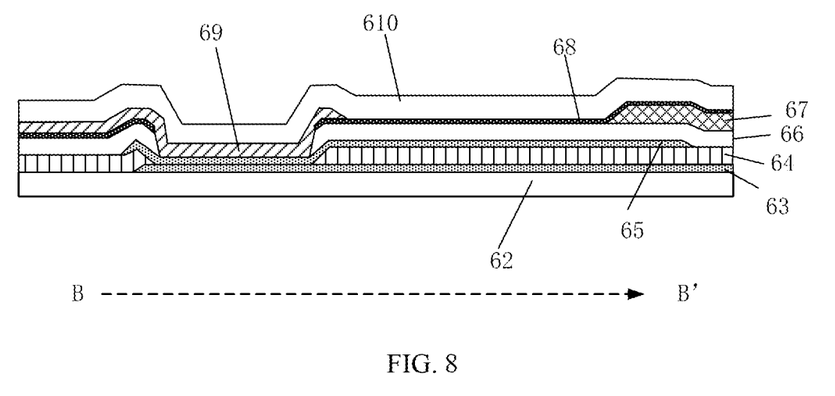
FIG. 8 is a schematic cross-sectional diagram taken at B-B' in FIG. 7.

With reference to FIG. 8, FIG. 8 is a schematic cross-sectional diagram taken at B-B' in FIG. 7. FIG. 7 is a schematic plan diagram of the lead area of the display panel, and FIG. 8 is a schematic cross-sectional diagram of the overlapping area (namely, the exit position of the lead area) of the lead area of the display panel. As can be seen from FIG. 8, the display panel includes:

a first planarization layer (PLN1) 62 for serving as an insulating layer between a first source-drain metal layer (not shown in the figures) and a second source-drain metal layer 63;

a second source-drain metal layer (SD2) 63;

a second planarization layer (PLN2) 64 for serving as an insulating layer between the second source-drain metal layer 63 and the third source-drain metal layer 65;

a third source-drain metal layer (SD3) 65, in a B' direction (the direction of the bending area), the second source-drain metal layer 63 is used for forming signal wirings and touch wirings, and in the B direction (the direction of the lead area), the first source-drain metal layer 61, the second source-drain metal layer 63, and the third source-drain metal layer 65 are overlapped as the signal wirings; in other embodiments of the present disclosure, the signal wirings of the lead area and the bonding area may also be formed using two layers or one layer of SD metal, which is not limited by the present disclosure, in addition, in the bending area, it is not limited to use SD2 to form signal wirings and touch wirings, and SD1 or SD3 can also be used, which is not limited by the present disclosure;

a third planarization layer (PLN3) 66;

a pixel definition layer (PDL) 67; and an insulating layer 68, for serving as an insulating layer of TX wirings and Rx wirings of touch wirings; in the embodiment of the present disclosure, the touch wirings include a first metal layer (M1, not shown in the figures), the insulating layer 68, and a second metal layer (M2) in the lead area and the bonding area. One layer of the first metal layer and the second metal layer is used for forming the Tx wirings and the other layer is used for forming the Rx wirings; the insulating layer may be formed, for example, of silicon nitride or the like.

A second metal layer (M2 layer) 69, which is overlapped with a third source-drain metal layer (SD3) 65 via the overlapping hole on the third planarization layer (PLN3) 66, and the third source-drain metal layer (SD3) 65 is overlapped with the second source-drain metal layer (SD2) 63, to complete the connection of the touch wiring (M2) in the lead area and the touch wiring (SD2) in the bending area.

A protective layer (OC2 layer) is used to protect the touch wirings.

In the above embodiments, in a bending area of a non-display area of a display panel, touch wirings and sub-signal wiring groups (including at least one of the sub-signal wirings) are arranged alternately, so that the space utilization rate is improved, and the width of the bending area can be effectively reduced, which is conducive to the design of the narrow border. At the same time, the distance between adjacent touch wirings is also increased, and the mutual interference between signals of the touch wirings is reduced. In addition, the area occupied by the signal wirings is also effectively increased, reducing the resistance of the signal wirings. Furthermore, the film layer in the display area is used to form touch wirings and signal wirings, which saves the process cost.

An embodiment of the present disclosure also provides a display device, including the display panel described in any of the above embodiments.

In the embodiments of the present disclosure, the display panel may be an OLED display panel, although the possibility of other types of display panels is not excluded.

In the embodiments of the present disclosure, the display device may be a mobile phone, a personal computer, a tablet computer, a television, etc.

In the embodiments of the present disclosure, in a bending area of a non-display area of a display panel, touch wirings and sub-signal wiring groups (including at least one of the sub-signal wirings) are arranged alternately, so that the space utilization rate is improved, and the width of the bending area can be effectively reduced, which is conducive to the design of the narrow border. At the same time, the distance between adjacent touch wirings is also increased, and the mutual interference between signals is reduced. In addition, the area occupied by the signal wirings is also effectively increased, reducing the resistance of the signal wirings.

The embodiments of the present disclosure have been described above with reference to the drawings, but the present disclosure is not limited to the above specific embodiments. The above-mentioned specific embodiments are only illustrative, not restrictive. Under the inspiration of the present disclosure, those of ordinary skill in the art can make many forms without departing from the purpose of the present disclosure and the scope protected by the claims, all of which are within the protection of the present disclosure.

What is claimed is:

1. A display panel, comprising:
   a base substrate comprising a display area and a non-display area located at the periphery of the display area, the non-display area comprising: a lead area, a bending area, and a bonding area;
   a plurality of touch wirings arranged on the base substrate, one end of the touch wirings being connected to the display area, and the other end extending to the bonding area via the lead area and the bending area;
   signal wirings comprising a first portion located at the lead area, a second portion located at the bending area, and a third portion located at the bonding area, the second portion comprising a plurality of sub-signal wirings, the plurality of sub-signal wirings being divided into a plurality of sub-signal wiring groups, and the sub-signal wiring groups comprising at least one of the sub-signal wirings;
   wherein in the bending area, the touch wirings and the sub-signal wiring groups are alternately distributed in a first direction, and the first direction intersects with an extension direction of the touch wirings and the sub-signal wirings in the bonding area.

2. The display panel according to claim 1, wherein a portion of the touch wirings in the bending area and a second portion of the signal wirings are made of a single layer of metal.

3. The display panel according to claim 2, wherein the portion of the touch wirings in the bending area and the second portion of the signal wirings are arranged in the same layer and the same material.

4. The display panel according to claim 3, wherein the portion of the touch wirings in the bending area and the second portion of the signal wirings are arranged in the same layer and the same material as a source-drain metal layer or a gate metal layer of the display panel.

5. The display panel according to claim 1, wherein in the lead area and/or the bonding area, the touch wirings and the signal wirings are arranged in different layers, and the touch wirings are located on one side of the signal wirings away from the base substrate.

6. The display panel according to claim 5, wherein in the lead area and/or the bonding area, the signal wirings are arranged in the same layer and the same material as the source-drain metal layer of the display panel.

7. The display panel according to claim 1, wherein in the lead area and/or the bonding area, the signal wirings are arranged in a plate shape, and the orthographic projection of the touch wirings on the base substrate is at least partially located in the orthographic projection area of the signal wirings on the base substrate.

8. The display panel according to claim 1, wherein in the bending area, each of the touch wirings occupies one pitch, and each of the sub-signal wiring groups occupies two pitches.

9. The display panel according to claim 1, wherein the touch wirings comprise touch driving wirings and touch sensing wirings.

10. The display panel according to claim 1, wherein the signal wirings are VSS signal lines.

11. The display panel according to claim 1, wherein the first direction is perpendicular to the extension direction of the touch wirings and the sub-signal wirings in the bonding area.

12. A display device, comprising the display panel according to claim 1.

13. The display device according to claim 12, wherein a portion of the touch wirings in the bending area and a second portion of the signal wirings are made of a single layer of metal.

14. The display device according to claim 13, wherein the portion of the touch wirings in the bending area and the second portion of the signal wirings are arranged in the same layer and the same material.

15. The display device according to claim 14, wherein the portion of the touch wirings in the bending area and the second portion of the signal wirings are arranged in the same layer and the same material as a source-drain metal layer or a gate metal layer of the display panel.

16. The display device according to claim 12, wherein in the lead area and/or the bonding area, the touch wirings and the signal wirings are arranged in different layers, and the touch wirings are located on one side of the signal wirings away from the base substrate.

17. The display device according to claim 16, wherein in the lead area and/or the bonding area, the signal wirings are arranged in the same layer and the same material as the source-drain metal layer of the display panel.

18. The display device according to claim 12, wherein in the lead area and/or the bonding area, the signal wirings are arranged in a plate shape, and the orthographic projection of the touch wirings on the base substrate is at least partially located in the orthographic projection area of the signal wirings on the base substrate.

19. The display device according to claim 12, wherein in the bending area, each of the touch wirings occupies one pitch, and each of the sub-signal wiring groups occupies two pitches.

20. The display device according to claim 12, wherein the touch wirings comprise touch driving wirings and touch sensing wirings.

* * * * *